(12) United States Patent
Srivastavaan et al.

(10) Patent No.: US 7,187,570 B2
(45) Date of Patent: Mar. 6, 2007

(54) CONTENT ADDRESSABLE MEMORY ARCHITECTURE PROVIDING IMPROVED SPEED

(75) Inventors: Rajeev Srivastavaan, Delhi (IN); Chiranjeev Grover, Delhi (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 92 days.

(21) Appl. No.: 10/804,562

(22) Filed: Mar. 19, 2004

(65) Prior Publication Data

US 2004/0223364 A1  Nov. 11, 2004

(30) Foreign Application Priority Data

Mar. 20, 2003  (IN) .......................... 323/DEL/2003

(51) Int. Cl.
*G11C 15/00* (2006.01)
(52) U.S. Cl. ..................... 365/49; 365/189.07; 365/233
(58) Field of Classification Search .................. 365/49, 365/189.07, 233
See application file for complete search history.

(56) References Cited

U.S. PATENT DOCUMENTS

| | | | |
|---|---|---|---|
| 5,877,714 A * | 3/1999 | Satoh | ........................... 341/87 |
| 6,044,005 A | 3/2000 | Gibson et al. | |
| 6,324,087 B1 | 11/2001 | Pereira | |
| 6,353,548 B2 * | 3/2002 | Helwig et al. | ................. 365/49 |
| 6,362,993 B1 | 3/2002 | Henderson et al. | |
| 6,373,738 B1 | 4/2002 | Towler et al. | |
| 6,452,822 B1 | 9/2002 | Chai et al. | |
| 6,477,071 B1 * | 11/2002 | Edman et al. | ................. 365/49 |
| 6,560,670 B1 | 5/2003 | Ichiriu | |
| 6,829,153 B1 | 12/2004 | Park et al. | |

* cited by examiner

*Primary Examiner*—Huan Hoang

(57) ABSTRACT

This invention provides, in an exemplary embodiment, a Content Addressable Memory ("CAM") architecture providing improved speed by performing mutually exclusive operations in first state of a clock cycle and by performing at least one operation, dependent on at least one previous operations, in the second state of the same clock cycles. The Content Addressable Memory (CAM) architecture comprises an array of CAM cells connected to a compare-data-write-driver and to a read/write block, for receiving the compare-data and for reading and/or writing data in the array of CAM cells respectively, outputs of the said CAM cell are coupled to a match block providing match outputs signal lines that identifies a match/no-match at the end of a search operation, and a control logic for implementing search and address decoding operations during first state and enabling read-or-write operations within the second state of the same clock cycle in the event of a match.

20 Claims, 10 Drawing Sheets

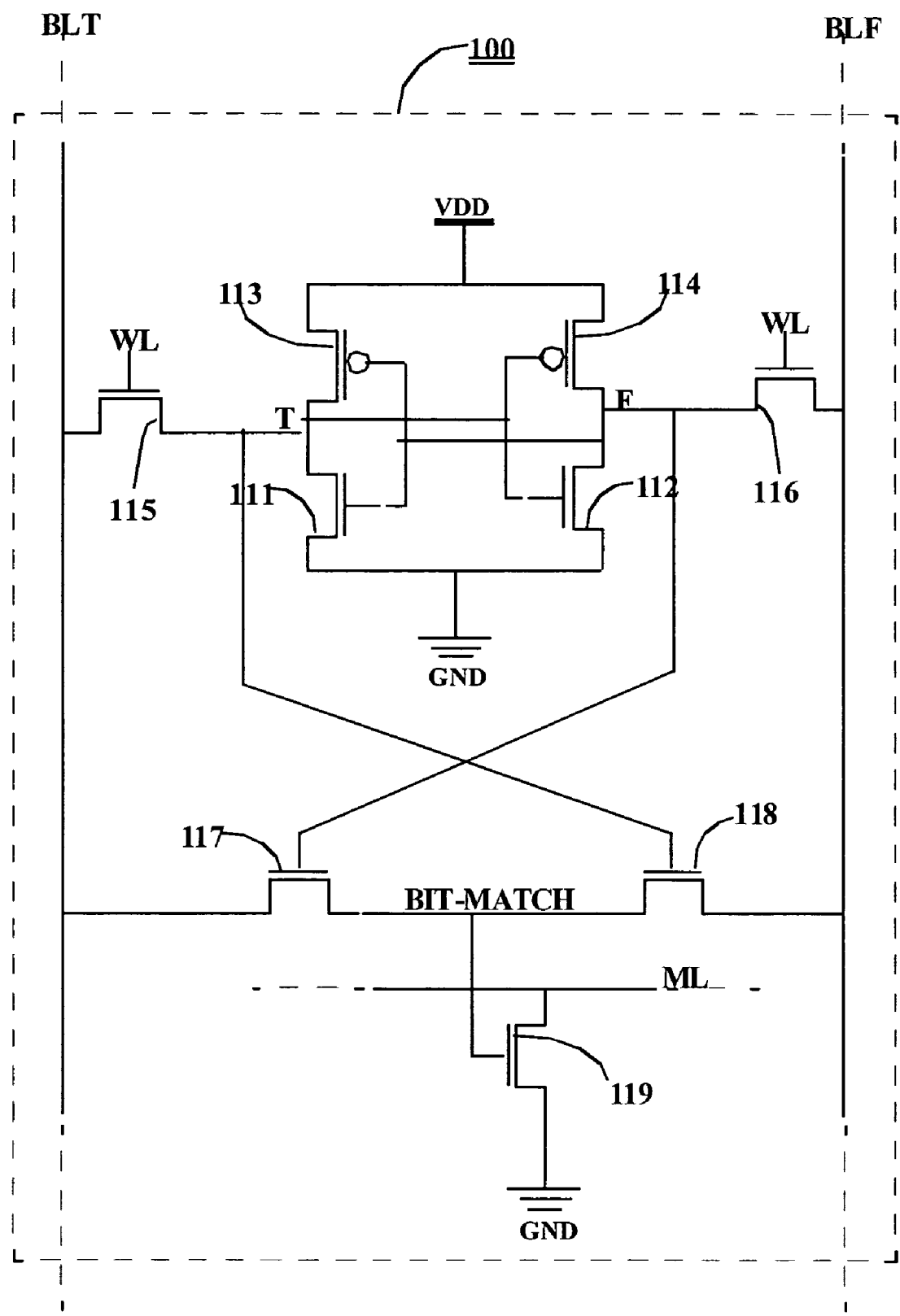
FIG. 1 : PRIOR ART

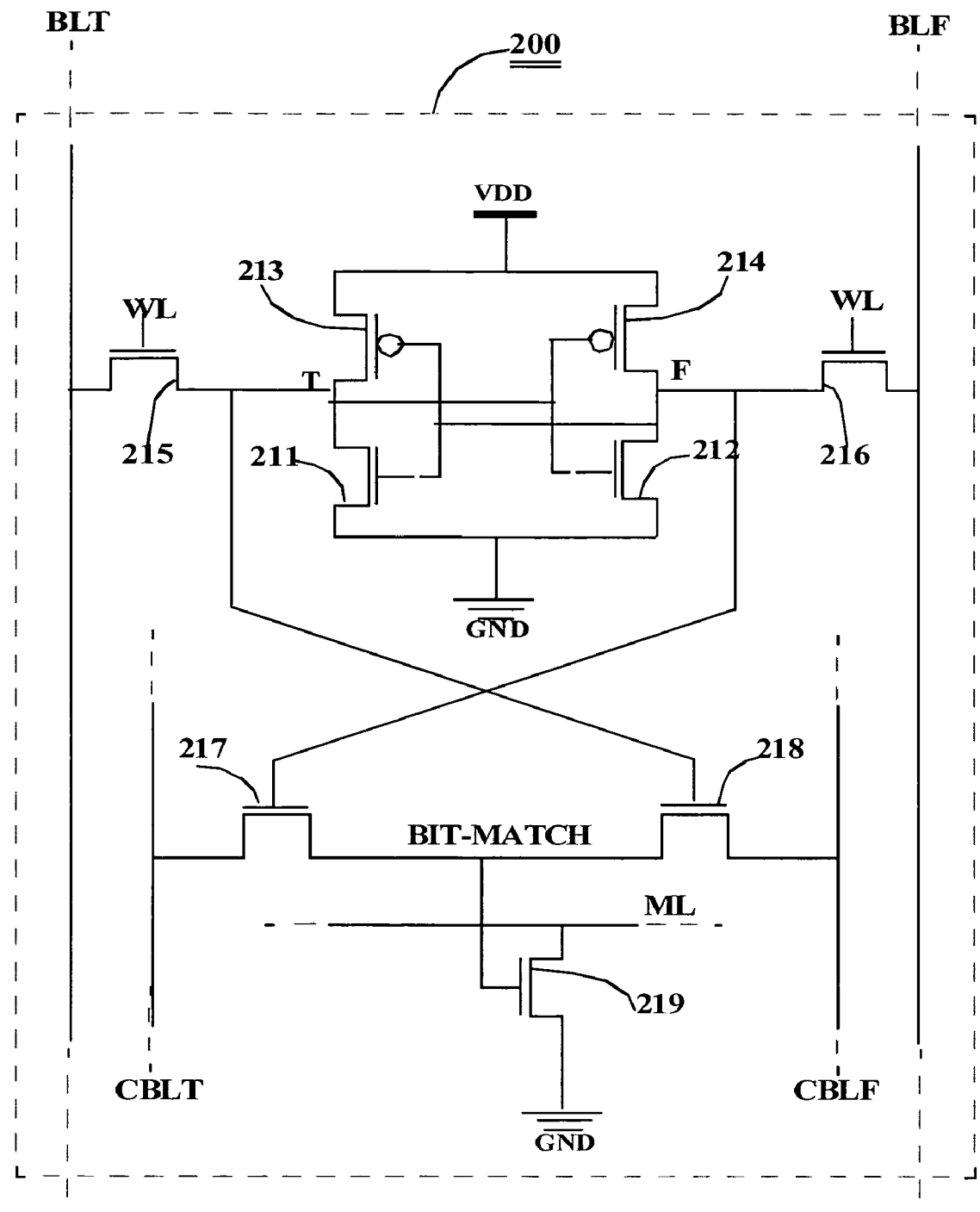
FIG. 2 : PRIOR ART

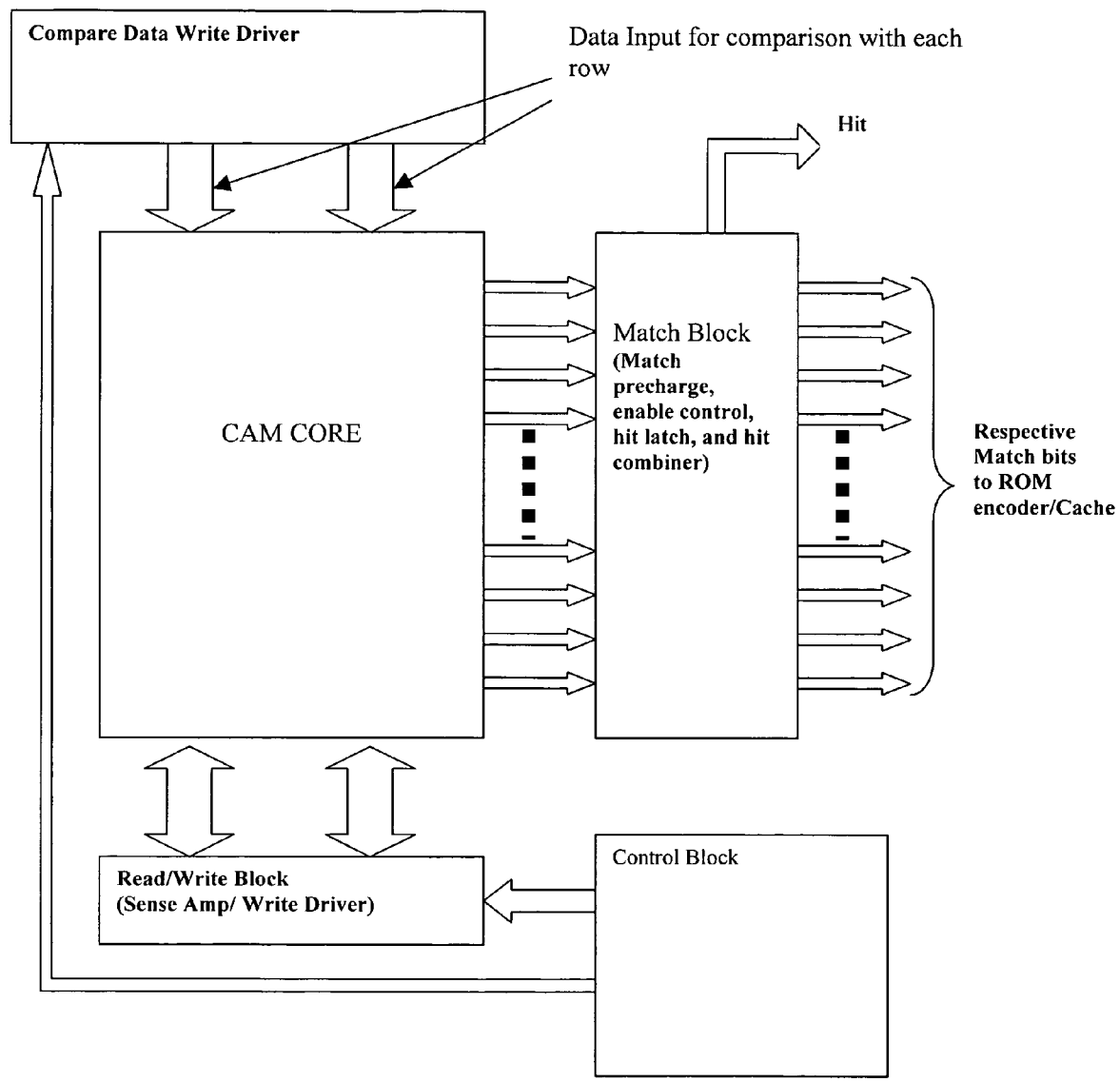
Figure No.3 : The full Architecture

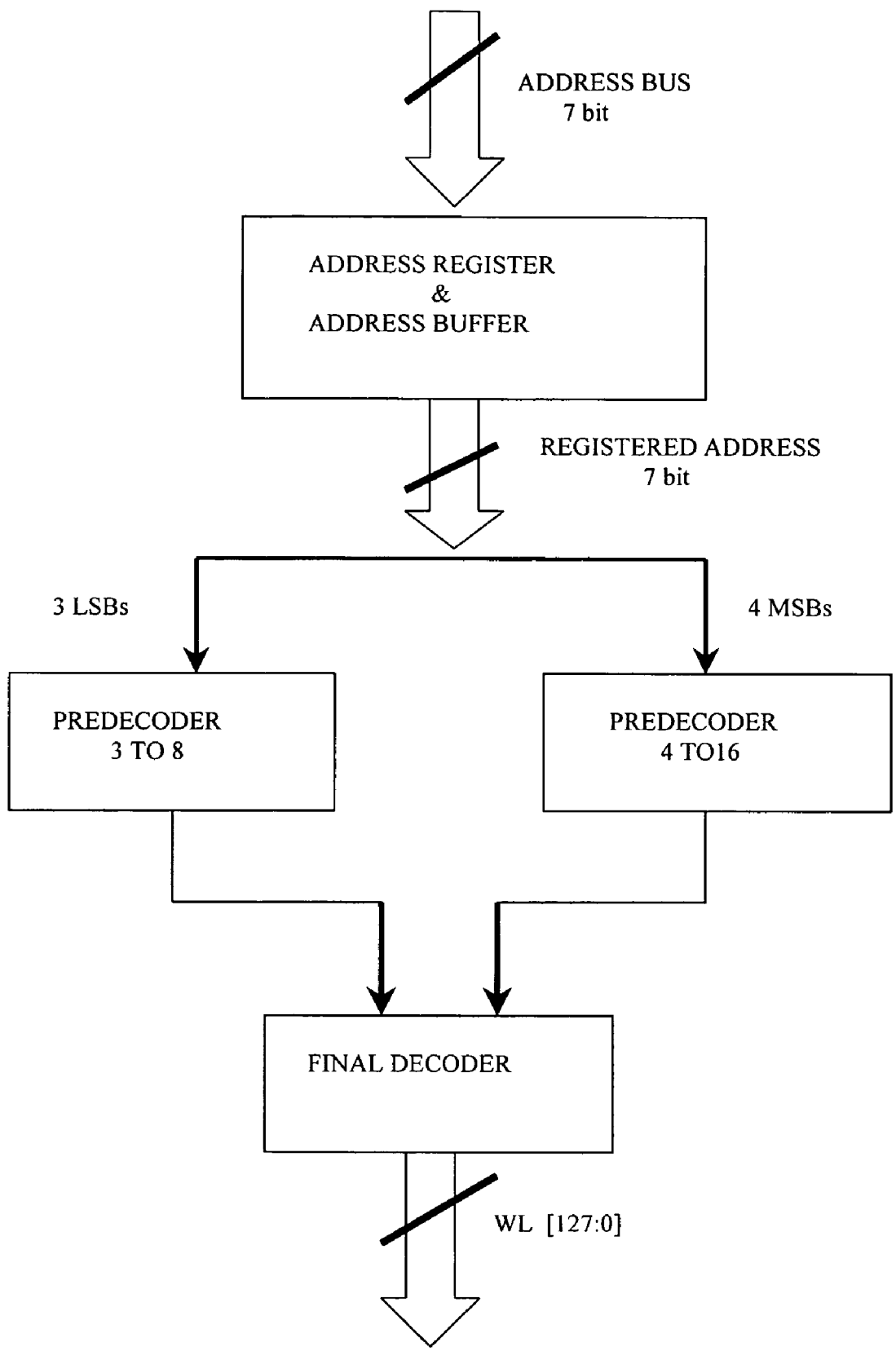
Figure 4: Decoder Block

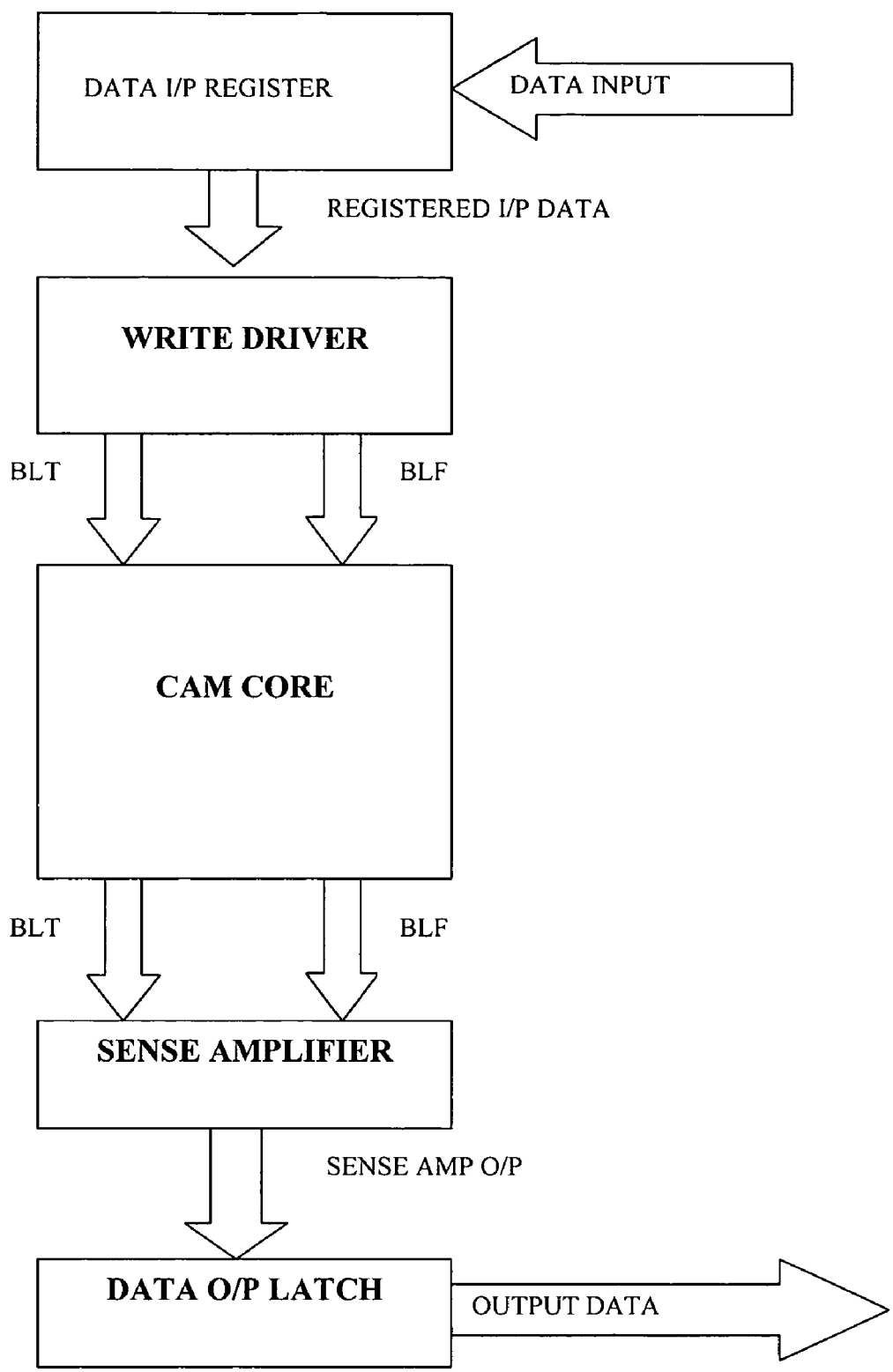
Figure No. 5 : Normal Read Write Operation in CAM

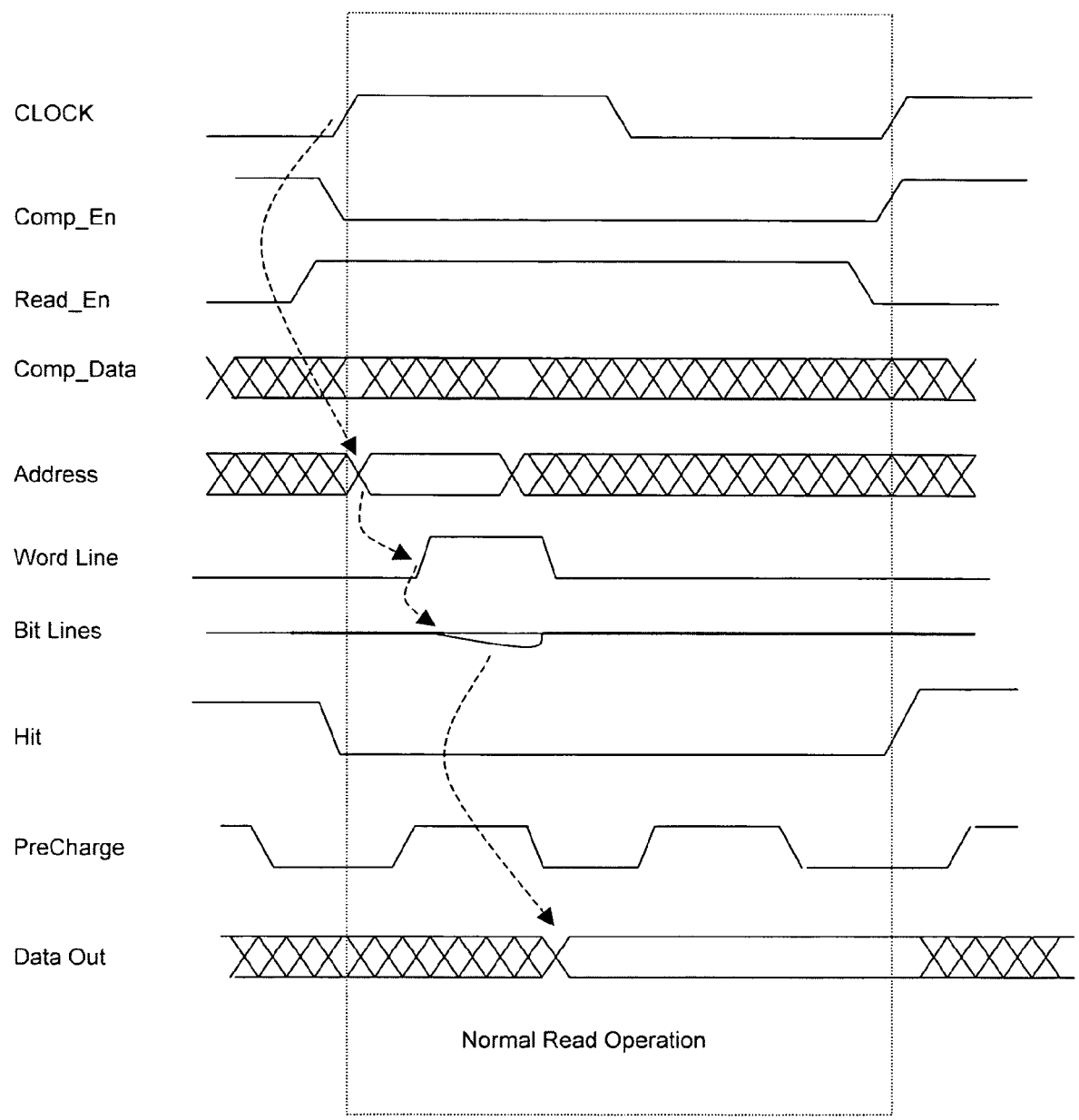
Figure 6 : Wave Form for Normal Read Operation

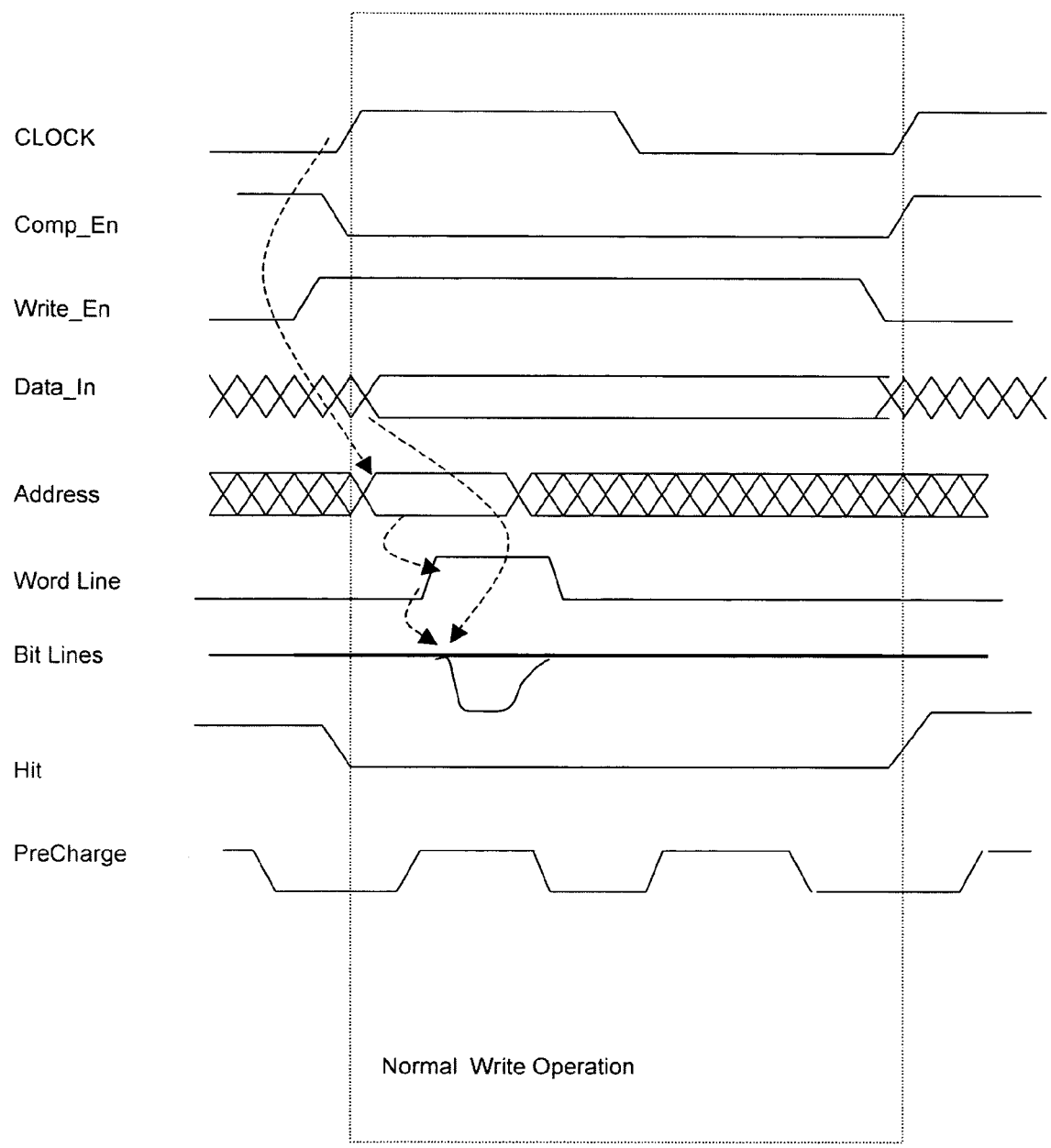
Figure7   Normal Write Operation

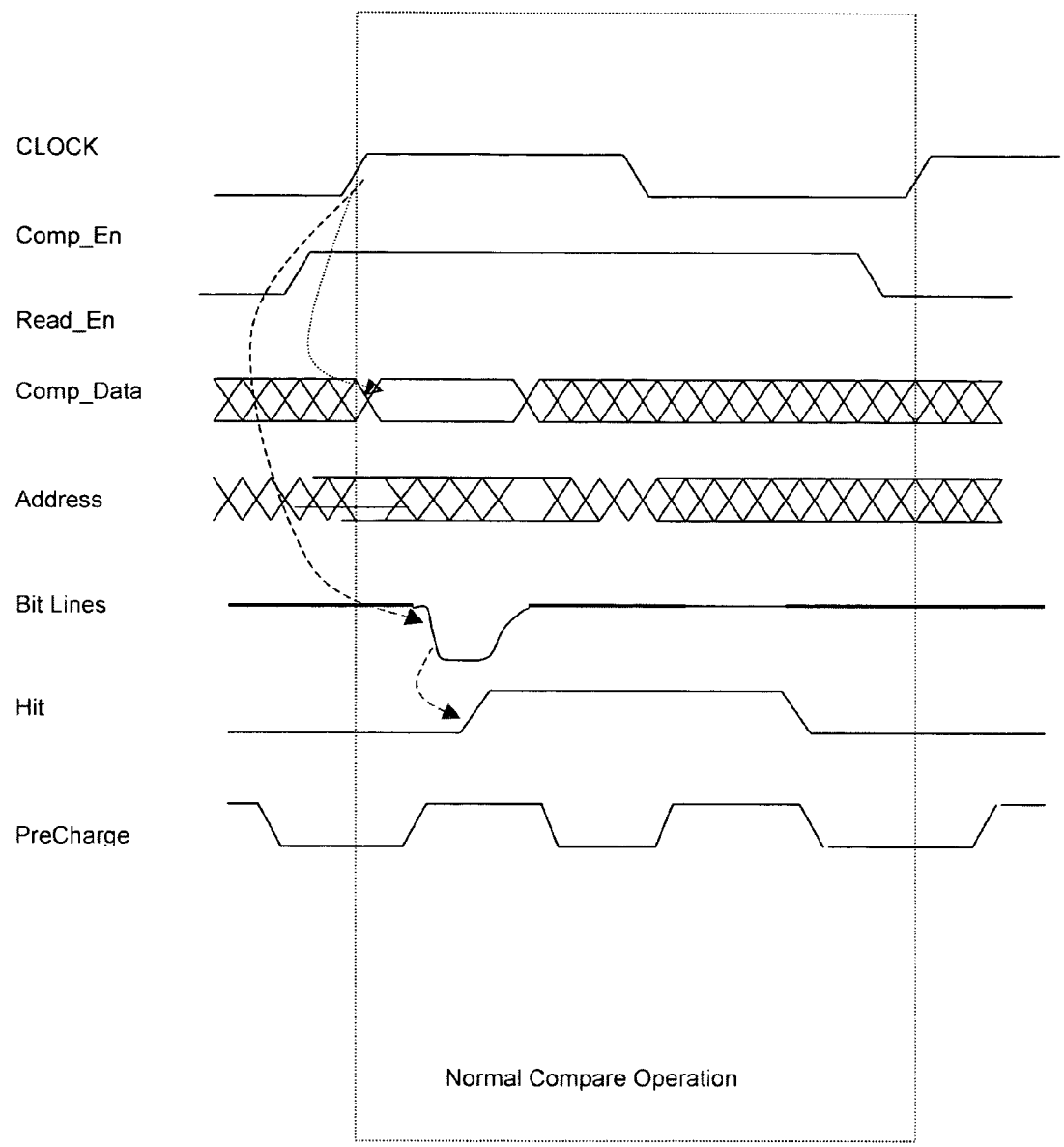
Figure 8    Normal Compare Operation

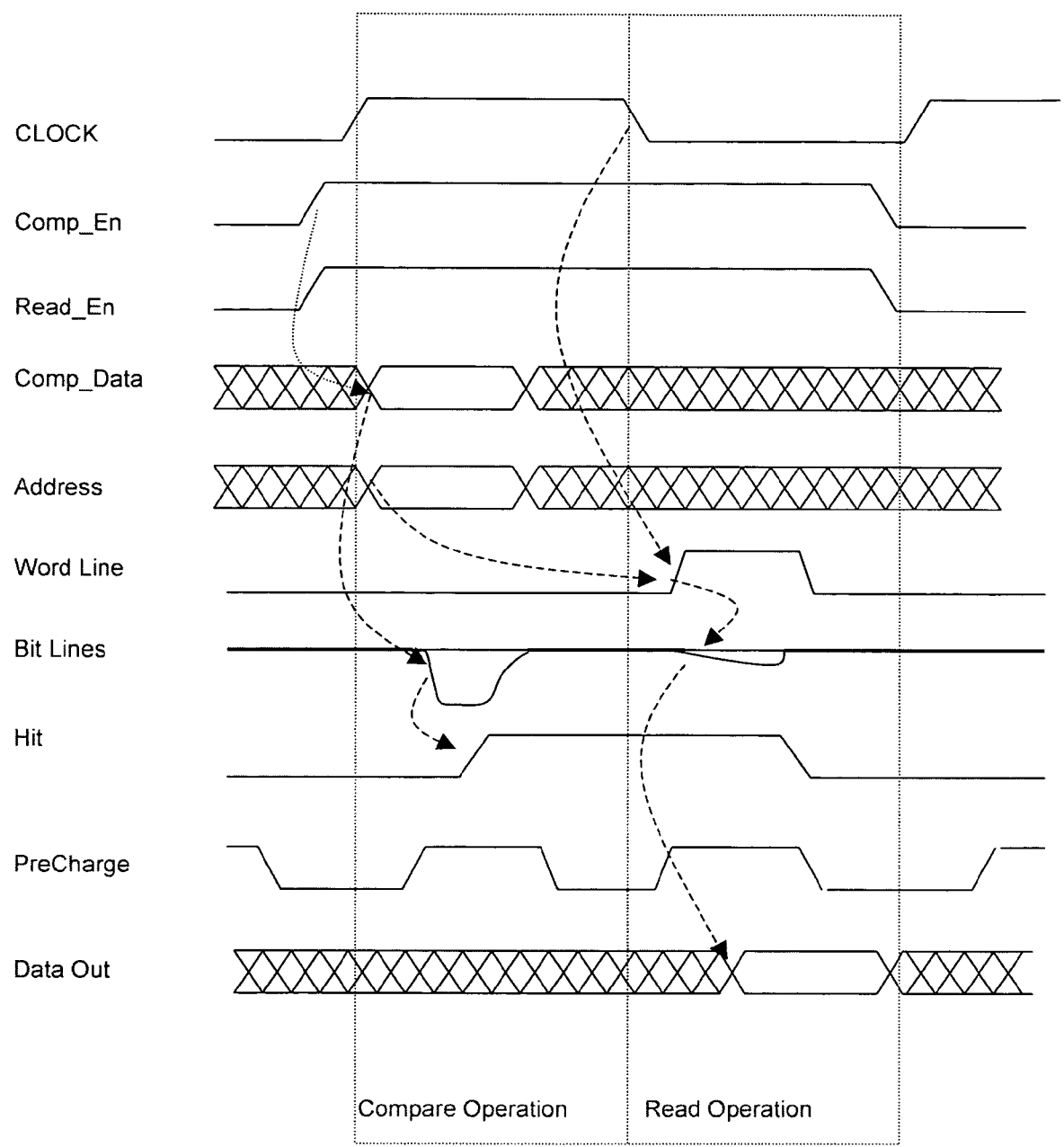
Figure 9  Compare & Read Operation in one Cycle

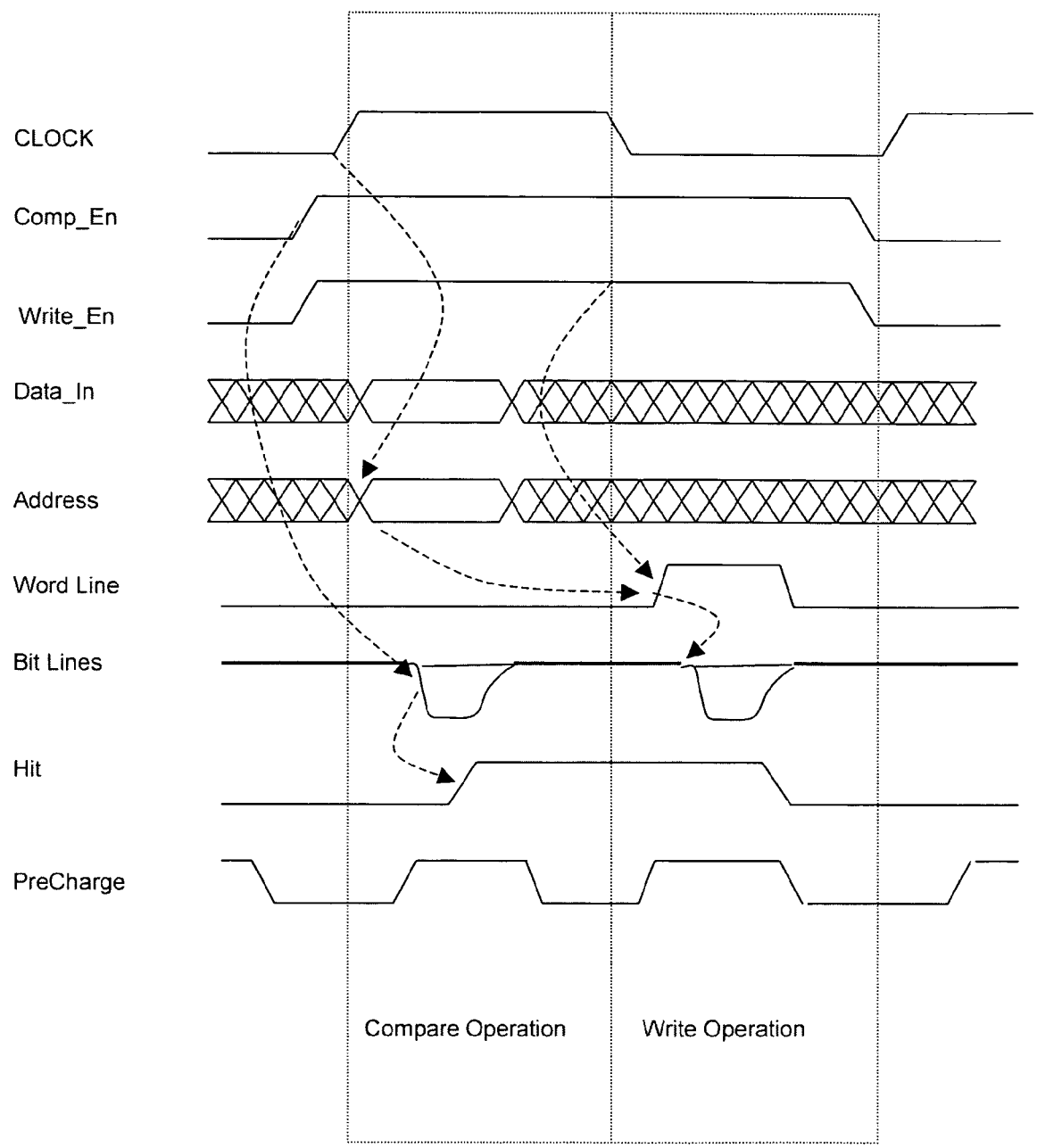
Figure 10  Compare & Write Operation in one Cycle

CONTENT ADDRESSABLE MEMORY ARCHITECTURE PROVIDING IMPROVED SPEED

TECHNICAL FIELD OF THE INVENTION

The invention relates generally to the field of binary Content Addressable Memory ("CAM") applications. More particularly the invention relates to a method and device providing improved performance by utilizing both phases of the clock cycles.

BACKGROUND OF THE INVENTION

A content addressable memory CAM architecture is an array of individual CAM cells. Each CAM cell consists of a data storage unit and comparison circuitry. The storage unit is used for storing data and the comparison circuitry is used to compare the compare-data with the data stored in storage unit and providing a signal indicating a match or mismatch. This signal is fed to a priority encoder for selecting one of the match signals, in the event of multiple signals, as the final output.

Throughout this disclosure, logical "1" refers to and is interchangeable with a logical "High" corresponding to a voltage VDD, while logical "0" refers to and is interchangeable with a logical "Low" corresponding to GND. FIG. 1 illustrates a PRIOR ART 9-transistor CAM cell 100 using a NOR configuration. The CAM cell 100 includes an SRAM cell for data storage, comprising a pair of cross-coupled inverters formed by transistors 111, 112, 113 and 114 and a pair of access transistors 115 and 116. The comparison circuitry of the CAM cell 100 consists of a pair of pass transistors 117 and 118. The conducting terminals of the pass transistor 113 and 111 are connected in series between the supply voltage VDD and ground GND while the control terminals are connected to the common conducting terminals F of pass transistors 114 and 112. The conducting terminals of pass transistor 114 and 112 are also connected in series between VDD and GND while the control terminals are connected to the common conducting terminals T of pass transistors 113 and 111. The conducting terminals of pass transistors 115 and 116 connect nodes T and F to the corresponding bit lines BLT and BLF while the control terminals are connected to word line WL. The pass transistors 117 and 118 are connected in series between bit lines BLT and BLF and the common node is labeled as the Bit-Match node. The control terminals of transistors 117 and 118 are coupled to nodes F and T, respectively. Output transistor 119 is coupled between the match line ML and ground GND and its control terminal is connected to the Bit-Match node of the CAM cell.

The READ and WRITE operations of this CAM cell 100 are the same as those of a standard 6-transistor SRAM cell, wherein the precharge state of bit lines BLT and BLF is logical "High". During the SEARCH operation, bit lines BLT and BLF are initially precharged to logical "Low" and ML is precharged to logical "High". Then the comparand bit is placed on BLT and its complement is placed on BLF. If the comparand bit matches with the data bit stored in the CAM cell, then one of the pass transistors 117 or 118 drives the Bit-Match node to logical "0" and therefore ML remains at logical "High", indicating a match. On the other hand, if there is a mismatch between the applied comparand bit and the data bit stored in the CAM cell, then one of the pass transistors 117 or 118 drives the Bit-Match node to "VDD-Vtn", thereby turning the pull-down transistor 119 on and pulling down ML indicating a mismatch.

The CAM cell 100 requires a precharge to logical "Low" operation for bit lines and a precharge to logical "High" operation for ML when a SEARCH operation is requested if the default standby state is for a READ or a WRITE operation. Conversely, if the CAM cell 100 is ready for a SEARCH operation in its default standby state, then the bit lines must be precharged to logical "High" and ML is thereby discharged when a READ or WRITE operation is requested. It is known that both bit lines and ML impose a heavy capacitive load on their drivers and prechargers. Therefore, CAM cell 100 consumes more power and provides larger READ/WRITE/SEARCH access times.

FIG. 2 illustrates another PRIOR ART 9-transistor CAM cell 200 using a NOR configuration. The only difference between CAM cell 100 and 200 is that CAM cell 200 is provided with dedicated lines CBLT and CBLF for the search operation as shown in the FIG. 2. Thus, CAM cell 200 provides more flexibility in the timing of READ, WRITE and SEARCH operations but at the cost of hardware overhead required for controlling the dedicated compare bit lines CBLT and CBLF.

SUMMARY OF THE INVENTION

To address the above-discussed deficiencies of the prior art, a primary object of the present invention is to obviate the above drawbacks and provide memory architecture with higher speed and smaller size. Another object of the invention is to combine "compare and write" or "compare and read" operations in one clock cycle to increase the speed of operation without increasing the area of the chip.

To achieve the objectives, this invention provides a Content Addressable Memory (CAM) architecture providing improved speed, comprising:

an array of CAM cells connected to a compare-data-write-driver and to a read/write block, for receiving the compare-data and for reading and/or writing data in the array of CAM cells respectively, outputs of the said CAM cell are coupled to a match block providing match outputs signal lines that identifies a match/no-match at the end of a search operation, and;

a control logic for implementing search and address decoding operations during first state and enabling read-or-write operations within the second state of the same clock cycle in the event of a match.

The control logic comprising a sequencing circuit that enables the data comparators of the CAM cell array and the address decoder of read/write block during the first state of the clock and enables the read-or-write operation in the second state of the same clock.

The invention further provides a method for improving speed of a Content Addressable Memory (CAM) architecture comprising the steps of:

connecting an array of CAM cells to a compare-data-write-driver and to a read/write block, for receiving the compare-data and for reading and writing data in the CAM cell respectively, coupling a match block to said array of CAM cell providing match outputs signal lines for identifying a match/no-match at the end of a Search operation, performing the search and address decoding operations during first state of the clock cycle, and;

implementing the read/write operation after a successful search during the second state of the same clock cycle.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The present invention will now be described with reference to the accompanying drawings, in which like reference numerals represent like parts, and in which:

FIG. 1 shows a PRIOR ART 9-transistor CAM cell architecture;

FIG. 2 shows another PRIOR ART 9-transistor CAM cell architecture;

FIG. 3 shows a block diagram of an exemplary CAM architecture in accordance with the present invention;

FIG. 4 shows a data flow chart of a decoder;

FIG. 5 shows a data flow chart for the normal read and write operation;

FIG. 6 shows a timing diagram for the normal read operation;

FIG. 7 shows a timing diagram for the normal write operation;

FIG. 8 shows a timing diagram for the normal compare operation;

FIG. 9 shows a timing diagram for the combine operation of compare and read; and FIG. 10 shows a timing diagram for the combine operation of compare and write.

DETAILED DESCRIPTION OF THE INVENTION

FIGS. 1 and 2 have already been described with reference to PRIOR ART implementations under the background to the invention. FIGS. 3 through 10, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged Content Addressable Memory ("CAM") architecture.

FIG. 3 shows a block diagram of a CAM memory architecture in accordance with the present invention. The instant invention uses a Control Block for performing read/write and compare operations in parallel. The Control Block provides the flexibility to choose either to perform any one of the read/write/compare operations in normal mode or to perform the read/write and compare operations in combined mode.

In the normal mode compare operation the Control Block uses the Compare Data Write Driver to feed the compare data into the memory core through the bit lines. The bitline data is compared with the data stored in each cell of the Core. The results of the compare operation are then fed to the Match Block. The Match block generates a hit signal for the highest priority matching data. The Match block also provides a match/mismatch signal to the ROM encoder/Cache.

The Control Block sends a signal to Read/Write Block during the normal mode read/write operation. The address of the memory cell is decoded by the decoder with in the Read/Write Block. In case of a read operation, the word line corresponding to decoded address is enabled to provide the data contained in the memory at the bit lines. The data at the bit lines is then sensed by a sense amplifier. The output of the sense amplifier is latched in the output latch. In the case of a write operation, decoding is performed in a similar manner. Once the word line is selected, the data present at the Data input register is written on the selected line through a Write Driver.

For the combined compare and write operation, the address decoding and comparing are performed in the first half of the clock cycle. In the second half of the clock cycle the word line corresponding to the decoded address is enabled and the Write driver then performs the write operation.

For the combined compare and read operation, the address decoding and comparing are performed in first half of the clock cycle. In the second half of the clock cycle the word line corresponding to the decoded address is enabled, to provide the data contained in the memory at the bit lines. The data at the bit lines is then sensed by a sense amplifier. The output of sense amplifier is latched in the output latch.

FIG. 4 shows a data flow diagram of the decoder used for decoding the memory addresses. The decoder block has the input Address Registers followed by Address Buffers. The address is decoded in two stages with two Pre-Decoder Blocks. The Final Decoder stage generates the complete word line address.

FIG. 5 shows a data flow diagram for the normal read and write operation. For write operation the data is loaded into the Data I/P Register. The Write Driver receives the data input from the Data I/P Register and assigns the data to the respective bit lines of the CAM Core. A latch based sense amplifier and a data output latch are provided for a Read operation. The output latch preserves the last read data until the next read cycle. When there is no read/write operation, the bit lines are precharged to "high".

FIG. 6 shows the timing diagram of a normal read operation. As shown in the figure Comp_En is disabled on the positive edge of the clock cycle and read enable line Read_En is enabled. The decoder provides the Address of the memory to be read, and when the complete address is available the Word Line corresponding to the decoded address is enabled thereby providing data content in the memory cell to the bit lines. The data is sensed by a sense amplifier and made available at the Data Out.

FIG. 7 shows the timing diagram of a normal write operation. As shown in the figure, Comp_En is disabled at the positive edge of the clock cycle, and write enable line Write_En is enabled. The decoder provides the Address of the memory to be written, and when the complete address is available, the bit lines corresponding to the address are provided with the data, while the associated Word Line is enabled connecting the bit lines to the memory cell.

FIG. 8 shows the timing diagram for a normal compare operation. As shown in the figure, Comp_En is enabled at the positive edge of the clock cycle, and, the compare data signal Comp_Data is enabled providing the data at the bit lines. Depending upon Match/mis-Match a hit/miss is generated.

FIG. 9 shows the timing diagram for a combined compare and read operation. In the positive phase of the clock cycle, the compare and decoding operation are performed generating a hit/miss signal. The hit/miss signal is latched for each row of the core at the falling edge of the clock. The address decoder is also activated at the positive edge of the clock for selecting a word line for the read operation from the memory. The Address is decoded for the output of the Predecoder stage or the input of the final decoder stage. The negative clock cycle triggers the reading action, enables the final decoder, and selects the wordline corresponding to the address for the read operation.

FIG. 10 shows the timing diagram for the combined compare and write operation. The compare and decoding operations are performed at the positive phase of clock generating a hit/miss signal. The hit/miss signal is latched for each row of the core at the falling edge of the clock. The positive phase of clock also activates the address decoder for selecting a word line for the write operation from the memory. The Address is decoded up to the output of the Predecoder stage or the input of the final decoder stage. The negative edge of the clock cycle triggers the writing action, enables the final decoder, and selects the wordline corresponding to the address input for the write operation.

It will be apparent to those with ordinary skill in the art that the foregoing is merely illustrative intended to be exhaustive or limiting, having been presented by way of example only and that various modifications can be made within the scope of the above invention. It is intended that the present invention encompass such changes and modifications as fall within the scope of the appended claims and those that may be added during prosecution.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims as ultimately allowed.

What is claimed is:

1. A Content Addressable Memory ("CAM") architecture providing improved speed, comprising:
    an array of CAM cells connected to a compare-data-write-driver and to a read/write block, for receiving compare-data and for reading and/or writing data in the array of CAM cells respectively;
    outputs of said CAM cell are coupled to a match block providing match outputs signal lines that identifies a match/no-match at the end of a search operation; and
    a control logic for implementing search and address decoding operations during a first state and enabling read-or-write operation within a second state of the same clock cycle in the event of a match.

2. The CAM architecture as claimed in claim 1, wherein the control logic comprising a sequencing circuit that enables data comparators of the CAM cell array and an address decoder of read/write block during the first state of the clock and enables the read-or-write operation in the second state of the same clock.

3. A method for improving speed of a Content Addressable Memory ("CAM") architecture in steps of:
    connecting an array of CAM cells to a compare-data-write-driver and to a read/write block, for receiving compare-data and for reading and writing data in the CAM cell respectively;
    coupling a match block to said array of CAM cells providing match outputs signal lines for identifying a match/no-match at the end of a search operation;
    performing the search and address decoding operations during a first state of the clock cycle; and
    implementing the read/write operation after a successful search during a second state of the same clock cycle.

4. A content addressable memory device, comprising:
    a content addressable memory core, having a plurality of data lines, a plurality of word line address inputs, and a plurality of comparison result outputs;
    a compare data write driver, coupled to the plurality of data lines of the content addressable memory core, capable of providing data for comparison in a compare operation;
    a read/write block, coupled to the plurality of data lines and the plurality of word line address inputs of the content addressable memory core, capable of
        decoding a word line address of a cell of the content addressable memory core, and
        one of writing data from the data lines to the addressed cell in a write operation and reading data from the addressed cell to the data lines in a read operation; and
    a control block, coupled to the compare data write driver and the read/write block, capable of
        causing the compare data write driver and the content addressable memory core to perform a compare operation, and
        causing the read/write block to decode a word line address and to perform one of a write operation and a read operation,
    wherein the control block
        causes a compare operation and a decoding of a word line address to be performed during a first state of a first clock cycle, and
        causes one of a write operation and a read operation to be performed during a second state of the first clock cycle.

5. The content addressable memory device of claim 4, wherein the control block causes the read/write block to partially decode a word line address during the first state of the first clock cycle and to complete decoding of the word line address during the second state of the first clock cycle.

6. The content addressable memory device of claim 4, wherein the control block causes the read/write block to decode a word line address and to perform one of a write operation and a read operation during a second clock cycle, without causing the compare data write driver and the content addressable memory core to perform a compare operation during the second clock cycle.

7. The content addressable memory device of claim 4, wherein the control block causes the compare data write driver and the content addressable memory core to perform a compare operation during a second clock cycle, without causing the read/write block to perform one of a write operation and a read operation during the second clock cycle.

8. The content addressable memory device of claim 4, further comprising a match block, coupled to the comparison result outputs of the content addressable memory core, comprising a match output signal indicating whether a match was found during a compare operation.

9. The content addressable memory device of claim 8, wherein the control block causes the one of a write operation or read operation to be performed in the second state of the first clock cycle only if a match is found in the compare operation performed during the first state of the first clock cycle.

10. For use in a content addressable memory device, a method of performing both a compare operation and one of a write operation and a read operation on the content addressable memory device in a single clock cycle, the method comprising the steps of:
   during a first state of a first clock cycle
      causing the content addressable memory device to perform a compare operation, and
      decoding a word line address of a cell of the content addressable memory device; and
   during a second state of the first clock cycle, one of writing data to the addressed cell and reading data from the addressed cell.

11. The method of claim 10, wherein the step of decoding the word line address is partially performed during the first state of the first clock cycle and is completed during the second state of the first clock cycle.

12. The method of claim 10, further comprising the steps of:
   during a second clock cycle
      decoding a word line address of a cell of the content addressable memory device, and
      one of writing data to the addressed cell and reading data from the addressed cell,
   wherein the content addressable memory device is not caused to perform a compare operation during the second clock cycle.

13. The method of claim 10, further comprising the step of causing the content addressable memory device to perform a compare operation during a second clock cycle, wherein data is neither written to nor read from the content addressable memory device during the second clock cycle.

14. The method of claim 10, further comprising the step of generating a match signal indicating whether a match was found during the compare operation.

15. The method of claim 14, wherein the one of writing data to the addressed cell and reading data from the addressed cell during the second state of the first clock cycle is performed only if a match was found during the compare operation performed during the first state of the first clock cycle.

16. A data processing apparatus, comprising:
   a content addressable memory core having a plurality of data lines, a plurality of word line address inputs, and a plurality of comparison result outputs;
   a compare data write driver, coupled to the plurality of data lines of the content addressable memory core, capable of providing data for comparison in a compare operation;
   a read/write block, coupled to an address bus, data input and output connections, the plurality of data lines, and the plurality of word line address inputs of the content addressable memory core, capable of
      decoding a word line address of a cell of the content addressable memory core from a signal on the address bus, and
      one of
         loading data on the data input connection and writing the loaded data to the addressed cell in a write operation, and
         sensing data from the addressed cell on the data lines and latching the sensed data to the data output connection in a read operation; and
   a control block, coupled to the compare data write driver and the read/write block, capable of
      causing the compare data write driver and the content addressable memory core to perform a compare operation, and
      causing the read/write block to decode a word line address and to perform one of a write operation and a read operation,
   wherein the control block
      causes a compare operation and a decoding of a word line address to be performed during a first state of a first clock cycle, and
      causes one of a write operation and a read operation to be performed during a second state of the first clock cycle.

17. The data processing apparatus of claim 16, wherein the control block causes the read/write block to decode a word line address and to perform one of a write operation and a read operation during a second clock cycle, without causing the compare data write driver and the content addressable memory core to perform a compare operation during the second clock cycle.

18. The data processing apparatus of claim 16, wherein the control block causes the compare data write driver and the content addressable memory core to perform a compare operation during a second clock cycle, without causing the read/write block to perform one of a write operation and a read operation during the second clock cycle.

19. The data processing apparatus of claim 16, further comprising a match block, coupled to the comparison result outputs of the content addressable memory core, comprising a match output signal indicating whether a match was found during a compare operation.

20. The data processing apparatus of claim 19, wherein the control block causes the one of a write operation or read operation to be performed in the second state of the first clock cycle only if a match is found in the compare operation performed during the first state of the first clock cycle.

* * * * *